United States Patent
Engelhardt et al.

(10) Patent No.: US 12,372,201 B2
(45) Date of Patent: Jul. 29, 2025

(54) LUBRICANT DISPENSER

(71) Applicant: perma-tec Gmbh & Co. KG, Euerdorf (DE)

(72) Inventors: Ralf Engelhardt, Schweinfurt (DE); Matthias Lenhart, Bad Kissingen (DE)

(73) Assignee: perma-tec Gmbh & Co. KG, Euerdorf (DE)

( * ) Notice: Subject to any disclaimer, the term of this patent is extended or adjusted under 35 U.S.C. 154(b) by 0 days.

(21) Appl. No.: 18/684,873

(22) PCT Filed: Sep. 21, 2022

(86) PCT No.: PCT/EP2022/076261
§ 371 (c)(1),
(2) Date: Feb. 20, 2024

(87) PCT Pub. No.: WO2023/088594
PCT Pub. Date: May 25, 2023

(65) Prior Publication Data
US 2024/0353059 A1    Oct. 24, 2024

(30) Foreign Application Priority Data
Nov. 17, 2021   (DE) .................. 10 2021 129 977.2

(51) Int. Cl.
*F16N 7/38*   (2006.01)
*G05F 1/46*   (2006.01)
(Continued)

(52) U.S. Cl.
CPC .............. *F16N 7/38* (2013.01); *H05K 1/0296* (2013.01); *H05K 1/181* (2013.01);
(Continued)

(58) Field of Classification Search
CPC . F16N 7/38; F16N 29/00; F16N 13/02; F16N 11/08; F16N 2230/02;
(Continued)

(56) References Cited

U.S. PATENT DOCUMENTS 5,634,531 A * 6/1997 Graf ................. F16N 29/00
                                               184/7.4
6,012,551 A * 1/2000 Raab ................ F16N 11/08
                                               184/7.4
(Continued)

FOREIGN PATENT DOCUMENTS

DE          44 22 407 A1   1/1996
DE    10 2010 033 954 A1   2/2012
(Continued)

OTHER PUBLICATIONS

International Search Report in PCT/EP2022/076261, mailed Jan. 13, 2023.

*Primary Examiner* — Henry Y Liu
(74) *Attorney, Agent, or Firm* — Collard & Roe, P.C.

(57) ABSTRACT

A lubricant dispenser has at least one lubricant reservoir, an electromechanical drive which acts on at least one actuation element for discharging lubricant from the lubricant reservoir, a battery which provides a battery voltage, and a control circuit-board assembly which has at least one main circuit board having an electronic circuit assembly including at least one central microcontroller and additional electronic functional components as well as conductor tracks. The electronic circuit assembly is subdivided into a plurality of circuit islands in each of which the maximum current flowing within the circuit island in question is limited.

23 Claims, 7 Drawing Sheets

Figure 2:
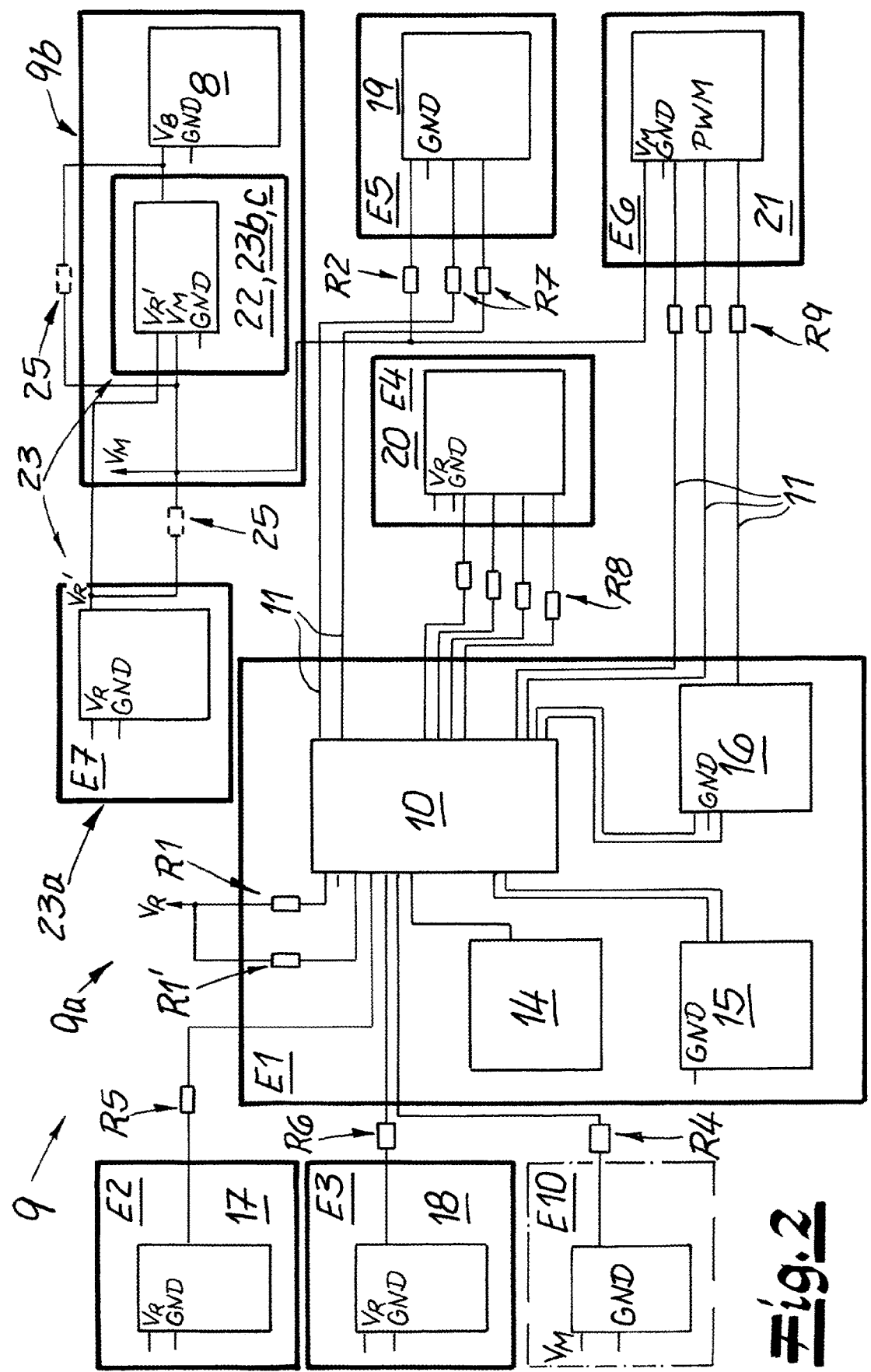

(51) Int. Cl.
*H05K 1/02* (2006.01)
*H05K 1/18* (2006.01)

(52) U.S. Cl.
CPC ...... *F16N 2230/02* (2013.01); *F16N 2270/20* (2013.01); *G05F 1/46* (2013.01); *H05K 2201/10022* (2013.01)

(58) Field of Classification Search
CPC .. F16N 2270/20; H05K 1/0296; H05K 1/181; H05K 2201/10022; G05F 1/04
USPC .......................................................... 184/37
See application file for complete search history.

(56) References Cited

U.S. PATENT DOCUMENTS

| | | | | |
|---|---|---|---|---|
| 6,125,969 | A * | 10/2000 | Graf | F16N 11/08 184/26 |
| 6,354,816 | B1 * | 3/2002 | Yang | F16N 11/08 184/37 |
| 6,447,573 | B1 * | 9/2002 | Rake | F16N 39/005 96/417 |
| 6,498,956 | B1 * | 12/2002 | Yang | F16N 29/02 184/7.4 |
| 6,561,316 | B1 * | 5/2003 | Graf | F16N 29/02 184/38.4 |
| 8,544,610 | B2 * | 10/2013 | Paluncic | F16N 11/08 184/26 |
| 8,593,838 | B2 * | 11/2013 | Poremba | H02H 9/008 363/50 |
| 8,783,418 | B2 * | 7/2014 | Orlitzky | F16N 13/02 184/37 |
| 8,844,679 | B2 * | 9/2014 | Conley | F16N 29/02 184/6.28 |
| 9,004,228 | B2 * | 4/2015 | Hildenbrand | F16N 19/00 184/26 |
| 9,022,177 | B2 * | 5/2015 | Conley | F16N 7/14 184/6.4 |
| 9,151,443 | B2 * | 10/2015 | Orlitzky | F16N 11/08 |
| 9,212,779 | B2 * | 12/2015 | Conley | F16N 7/14 |
| 9,222,618 | B2 * | 12/2015 | Donovan | F16N 13/02 |
| 9,388,940 | B2 * | 7/2016 | Conley | F16N 13/02 |
| 9,458,964 | B2 * | 10/2016 | Eisenbacher | F16N 11/08 |
| 9,671,065 | B2 * | 6/2017 | Conley | F16N 29/00 |
| 10,107,450 | B2 * | 10/2018 | Yang | F16N 11/08 |
| 10,502,366 | B2 * | 12/2019 | Lee | F16N 7/385 |
| 10,851,940 | B2 * | 12/2020 | Conley | F16N 13/02 |
| 11,499,673 | B2 * | 11/2022 | Wawrzola | F16N 29/04 |
| 11,512,810 | B2 * | 11/2022 | Wawrzola | F01M 11/10 |
| 11,852,292 | B2 * | 12/2023 | Kuno | F16N 11/08 |
| 12,025,269 | B2 * | 7/2024 | Conley | F16N 29/04 |
| 2011/0253481 | A1 * | 10/2011 | Lin | F16N 11/08 184/108 |
| 2012/0038345 | A1 * | 2/2012 | Poremba | H02H 9/02 323/369 |

FOREIGN PATENT DOCUMENTS

| | | |
|---|---|---|
| DE | 10 2011 056 247 B4 | 4/2014 |
| DE | 10 2012 100 035 B4 | 6/2014 |
| DE | 10 2019 106 681 A1 | 9/2020 |
| EP | 0 845 631 A1 | 6/1998 |
| EP | 1 202 424 A2 | 5/2002 |

* cited by examiner

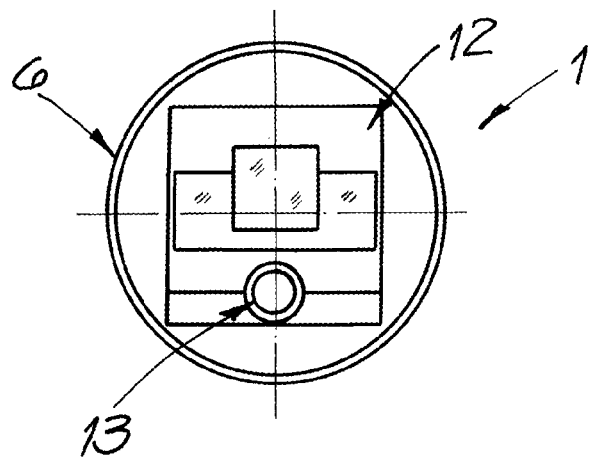
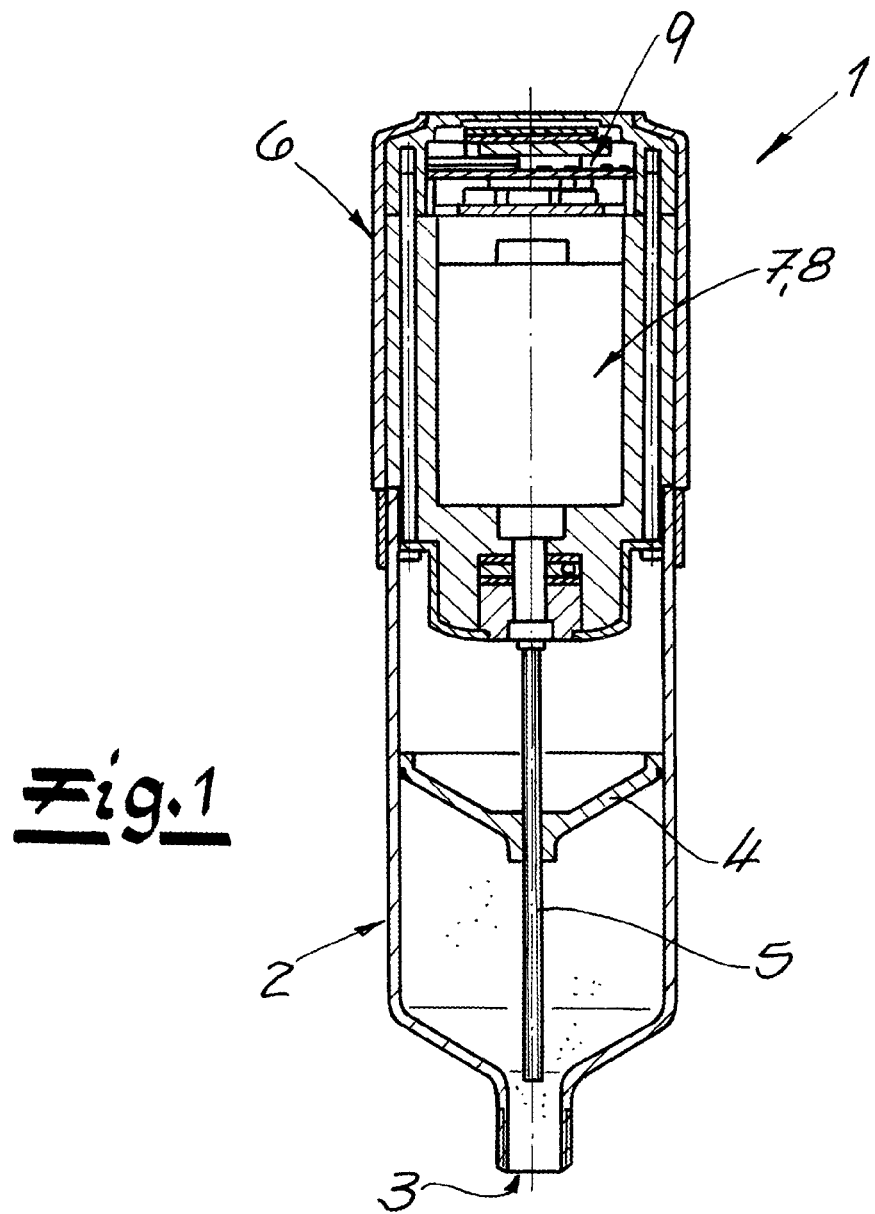
Fig. 1

LUBRICANT DISPENSER

CROSS REFERENCE TO RELATED APPLICATIONS

This application is the National Stage of PCT/EP2022/076261 filed on Sep. 21, 2022, which claims priority under 35 U.S.C. § 119 of German Application No. 10 2021 129 977.2 filed on Nov. 17, 2021, the disclosure of which is incorporated by reference. The international application under PCT article 21 (2) was not published in English.

The invention relates to a lubricant dispenser having at least
- a lubricant reservoir, for example a cartridge filled with lubricant,
- an electromechanical drive, for example an electric motor, that acts on at least one actuation element (for example a piston, a pump or the like) for discharging lubricant from the lubricant reservoir,
- a battery (or battery assembly having multiple batteries) that provides a battery voltage,
- a control circuit-board assembly that comprises at least one main circuit board having an electronic circuit assembly comprising at least one central microcontroller and additional functional components as well as conductor tracks, wherein the control circuit-board assembly is connected, on the one hand, to the battery, and on the other hand, to the electromechanical drive.

Such lubricant dispensers are used, for example, for automated lubrication of machine parts or system parts, such as, for example, roller bearings, slide bearings, linear guides, chains or the like. The lubricant dispensers are connected, for example, to a lubrication location (for example of a bearing) and can dispense lubricants as a function of the running time of a machine, for example, or at predetermined or variable intervals. Possible lubricants that can be used are, for example, greases or oils. The reservoir container is also referred to as a cartridge, and such a cartridge can generally be connected, in a releasable and replaceable manner, to an electromechanical drive or a housing of the lubricant dispenser, to form a module, for example by means of a screw connection, plug-in connection, engagement connection, bayonet connection, or the like. In the case of the electromechanical drive, this is preferably an electric motor, or the electromechanical drive or the drive unit has an electric motor. The electric motor is preferably a (battery-driven) direct-current motor. The electromechanical drive and the control circuit-board assembly are generally arranged in a (common) housing of the lubricant dispenser, wherein this housing is coupled with the lubricant reservoir, for example.

The electromechanical drive can act, for example, on an actuation element, which is configured as a piston that is guided, for example, in the lubricant cartridge, to press out the lubricant, wherein the piston is connected, for example, to a spindle or the like, which is driven by the electromechanical drive. The circuit-board assembly arranged in the interior of the housing of the lubricant dispenser, for example, holds a circuit assembly as the control electronics of the lubricant dispenser. By way of these control electronics, the electromechanical drive is controlled in a targeted manner, in order, for example, to eject lubricant at preselected dispensing intervals. By way of the control electronics, furthermore a determination of the temperature can take place, so as to eject the lubricant, for example, as a function of the temperature, or to control the drive as a function of the temperature. Furthermore, displays can be implemented by way of the control electronics, for example LCD displays and/or LED displays, as well as a control panel for setting the lubricant dispenser.

A lubricant dispenser of the type described initially, having an electromechanical drive, is marketed by the applicant, for example under the product name "Star Vario." The simple and self-explanatory operation takes place, for example, by way of an LCD display having setting push buttons, so that changes in the settings are possible at all times. By way of the electromechanical, re-usable drive having a battery set, reliable, precise dispensing of lubricant takes place independent of temperature and counter-pressure.

In DE 10 2011 056 247 B4, a lubricant dispenser of the stated type, having an electromechanical drive, is described, which dispenser acts on a piston by way of a spindle, wherein a control circuit-board is also integrated into the housing of the lubricant dispenser.

Furthermore, a lubricant dispenser of the type described initially is known from DE 10 2012 100 035 B4, in which the lubricant cartridge is releasably connected to a carrier or housing, which cartridge holds a battery-operated motor to drive the spindle, wherein in the case of this embodiment, as well, the spindle is connected to a piston for pressing the lubricant out of the reservoir.

Alternatively to these embodiments, however, in which the drive acts on a piston as the actuation element, by way of a spindle, the invention also comprises embodiments, in which an electromechanical drive drives a pump, so as to convey a lubricant out of a reservoir container to an outlet. Such an embodiment is known, for example, from DE 10 2019 106 681 A1.

The invention consequently always relates to a lubricant dispenser having an electromechanical drive, for example with an electric motor, wherein the electric motors are generally configured as direct-current motors, which are operated by way of one or more batteries. Such lubricant dispensers with an electromechanical drive have outstandingly proven themselves in practice, because they particularly allow reliable, precise, and variably adjustable dispensing of lubricant. They can be used in many different ways, in the most varied environments.

However, particular challenges arise if the lubricant dispenser is supposed to be used in areas that are potentially at risk of explosion, in which safety is of particular importance, for example in areas in which combustible materials are produced, processed, transported or stored. These can be, for example, areas potentially at risk of explosion in the chemical and petrochemical industry, as well as in the conveying of petroleum and natural gas, and in mining. In the automotive industry, as well, there are areas potentially at risk of explosion, for example in the paint shop. Furthermore, power plants and steel plants are included, as well as areas in which coal or the like is transported, wherein conductive, explosive dust occurs.

In order to guarantee a high level of safety in such areas, there are generally strict legal safety requirements and standards, which must be adhered to by the operators of the facilities. In this regard, areas at risk of explosion are subdivided into different zones, which require different safety levels, wherein what is called "Zone 0" relates to the greatest hazard and therefore the highest safety level.

In particular, in those zones with the highest safety level, in practice, electrochemical lubricant dispensers are used for the automated lubrication of machines, systems, or the like, which dispensers work not with an electric motor drive, but rather with electrochemical drives, which are equipped with electrochemical gas cells, by way of which a piston, for example, for pressing out the lubricant is activated. The use of electrochemical lubrication systems in areas potentially at risk of explosion has proven itself. However, there is a fundamental need to use electromechanical lubrication systems in areas potentially at risk of explosion, as well. —This is where the invention takes its start.

The invention is based on the task of creating an electromechanically operated lubricant dispenser of the type described initially, which is characterized by a high level of inherent safety. Preferably, it should also be possible to use the lubricant dispenser even in areas potentially at risk of explosion that are in "Zone 0," in other words have an EPL protection level (Equipment Protection Level) "a."

To accomplish this task, the invention teaches, in the case of a generic lubricant dispenser of the type described initially, that the electronic circuit assembly is subdivided into a plurality of circuit islands (called "explosion protection islands") or has multiple circuit islands, wherein some or all of the circuit islands are limited in terms of power.

According to the invention, it is consequently provided that the maximum current possible within the circuit island in question is limited to a predetermined maximum value.

In this regard, the invention proceeds from the recognition that in the electronic components of the lubricant dispenser and, in particular, on or in the control circuit-board assembly, on the one hand excessive temperature increases must be restricted or avoided, and on the other hand, formation of sparks must be avoided, or the spark energy that occurs during spark formation must be greatly restricted.

The subdivision of the electronic circuit assembly into multiple explosion protection islands has the advantage that the maximum possible power in each individual protection island can be limited, for example by means of a power-limiting series resistor. If, for example, a short-circuit were to occur in a circuit island connected by means of a power-limiting resistor, then in this island or the defective part in question, the maximum possible power would be implemented. By means of the use of a power-limiting resistor, this maximum possible power is reduced, the resistor goes into power adaptation, so that the electrical power that is available afterward merely comes to the reduced value, which is calculated using $P=U^2/(4 \times R)$. The power-limiting resistor is then designed, in practice, in such a manner that in the event of a defect during power adaptation, the maximum possible power is not greater than the maximum power losses allowed for the integrated circuits used in the circuit island, in each instance. In order to achieve a particularly high explosion protection level, a safety factor can be taken into consideration, in addition.

By means of the measures according to the invention, the possibility exists, in particular, of selecting the distances between the conductor tracks and the sizes of the components to be relatively small within each individual protection island. The distances of conductor tracks and components between individual protection islands are selected to be greater, in comparison, so that in total, impermissible heating and spark formation is reliably prevented. Thus, it is preferably provided that the distances of the conductor tracks between individual circuit islands do not go below a predetermined minimum distance, wherein preferably, this minimum distance is greater than the distance between the conductor tracks within the circuit islands. Thus, even very small SMD components can be used within the circuit islands, with a small distance and a particularly small distance between the connectors. Thus, according to the invention, the default values, in each instance, from the relevant standards, for example from the standard IEC 60079-11, can be implemented.

The subdivision of the circuit assembly into multiple explosion protection islands is a significant aspect of the invention, which will be discussed in greater detail below. Even if, according to the invention, the explosion protection islands are power-limited, in each instance, within the control circuit-board assemblies, it is possible to implement circuit islands, the components of which do not permit a power limitation, for example in the case of a motor, in which the use of a power-limiting series resistor would produce such a great voltage drop that the remaining residual voltage would no longer be sufficient for correct operation of the motor. In such circuit islands, in which a power limitation is refrained from, for example by way of a resistor, it is practical to implement a thermal cutoff, in each instance. This will also be discussed further.

The power limitation of the individual circuit islands, specifically of at least some circuit islands, stands in the foreground. For this purpose, the aforementioned power-limiting resistors, for example series resistors, are used.

Alternatively or supplementally, an (additional) power limitation can be implemented between individual circuit islands, specifically preferably by means of one or more resistors (intermediate resistors), which are arranged between the circuit islands that are connected with one another, in each instance, or integrated into the electrical connection between the circuit islands, in each instance. Thus, for example, a (central) circuit island is implemented using a central microcontroller, and one, multiple or all the other circuit islands are connected to this central circuit island. Since the individual circuit islands, in each instance, are separately supplied with voltage, it is advantageous if the central circuit island having the microcontroller is protected by way of the aforementioned intermediate resistors, at which, for example, the short-circuit voltage drops, in the event of a short-circuit, on a circuit island, and thereby protects the central circuit island. In addition to the series resistors mentioned above, which are integrated into the voltage supply line in the case of the aforementioned circuit islands, consequently intermediate resistors can be integrated between individual circuit islands that are electrically or functionally connected to one another, so as to protect a circuit island if a disturbance occurs in an adjacent circuit island.

The operational safety or inherent safety of the lubricant dispenser can be improved, in a preferred further development of the invention, in that the circuit assembly (as a whole) is provided with or connected to a current-limiting device that limits the total energy within the (entire) circuit assembly.

In addition to the power limitation within the individual protection islands, consequently a total current limitation is preferably implemented, so that in particular, the energy of a spark that potentially occurs in the event of a defect is limited. Here, too, the goal is to achieve the desired explosion protection level, in each instance, for example for use in Zone 0. The current-limiting device is preferably designed to have multiple redundancy. For this purpose, optionally multiple, for example at least three current limiters are implemented, which are switched in parallel, for example.

By means of the redundancy, the operational safety or inherent safety is further increased, because even in the event of a failure or defect of one or, if applicable, even two current limiters, the overall current-limiting device of the circuit assembly will function reliably, so that, in particular, a limitation of the energy within a spark that occurs is reliably reduced. Optionally and particularly preferably, the current-limiting device (additionally) comprises a fuse, for example a melt fuse. When the maximum permissible current is reached, the melt fuse is destroyed, in a controlled manner, for example by way of a crowbar circuit.

In an alternative embodiment, if applicable, it is possible to do without an active (multi-redundant) current-limiting device having active current limiters. It can be sufficient to use only one fuse for current limitation, for example a melt fuse, or optionally also multiple fuses, for example melt fuses.

According to a further aspect of the invention, the circuit assembly is preferably provided with or connected to a voltage regulation device, which reduces the battery voltage to a regulated operating voltage. Such an embodiment is particularly advantageous if components are used that must/should be operated at a lower voltage than what is delivered by the battery or batteries. Furthermore, standards can require a safety distance of the maximally permitted voltage from the voltage that is used. In order to reduce this permitted (voltage) safety distance, a regulated voltage reduction is implemented, wherein the voltage supply for these components is also preferably implemented with triple redundancy. Thus, it is provided that the voltage regulation device is designed with multiple redundancy, and preferably comprises multiple, for example at least three voltage regulators, which are preferably switched in series. Since, in the event of a failure of the voltage regulation device, it would no longer be the reduced voltage (for example 3.3 V), but rather the full battery voltage (for example 4.5 V) that was applied to the components, the multiple-redundant embodiment has the advantage that in fact components, for example a microcontroller, can be used, which are designed for the reduced voltage and do not have to be designed for the higher battery voltage. Particularly preferably, what are called LDO components i.e., Low Dropout voltage regulators, are used as voltage regulators, which are preferably configured as series regulators. Preferably, no use is made of the alternatively used Zener diodes, which are usually used for voltage limitation in explosion protection.

The use of the voltage regulation device or the voltage regulators has the advantage that without any loss of safety, components, for example a microcontroller, can be used, which are designed only for this reduced voltage. If such components are used, however, the redundancy is particularly advantageous. Furthermore, the possibility exists of configuring the voltage regulation device or also each individual voltage regulator as a separate circuit island, with current limitation, so that, for example, the voltage regulation device as a whole or preferably each individual voltage regulator can be limited by means of a power-limiting resistor, in each instance. In the case of the voltage regulators, such a power-limiting resistor is preferably not switched as a series resistor, since a voltage drop at the series resistor could lead to an overly low voltage for the subsequent components. For this reason, it is practical to provide a power-limiting resistor in the ground line of the component, for example in the ground line of the voltage regulator (for example LDO), so that the full voltage is available for the voltage to be regulated, and only the regulation circuit as such is limited in terms of current.

According to a further interesting aspect of the invention, it is optionally provided that the control circuit-board assembly is not implemented only by means of a single circuit board, but rather that in addition to the main circuit board, an additional circuit board connected to it is provided. Thus, for example, the possibility exists of arranging the current-limiting device on the additional circuit board. Alternatively or supplementally, the voltage regulation device can be arranged on the additional circuit board, in part or in its entirety, in that, for example, one or more voltage regulators are arranged on the additional circuit board, and, if necessary, at least one voltage regulator is arranged on the main circuit board. It can be advantageous to implement all the voltage regulators on the additional circuit board.

A first advantage of the embodiment with a main circuit board, on the one hand, and an additional circuit board, on the other hand, lies in that different types and dimensions of insulating protective coatings of the circuits can be implemented. This is because in order to increase the operational safety or inherent safety, it can be advantageous to provide the circuit assembly with one or more electrical insulating protective coatings, in certain regions or entirely. This can be implemented differently on a main circuit board, on the one hand, and an additional circuit board, on the other hand. Thus, it can be practical to completely do without a protective coating on the main circuit board, and to provide a protective coating merely on the additional circuit board (in certain regions or entirely). Alternatively, it lies within the scope of the invention if the components on the main circuit board are coated, at least in certain regions, with a protective coating, for example a protective varnish. In this way, for example, the possibility exists of reducing the distances of the conductor tracks between individual protection islands, namely in the regions in which the conductor tracks and components are coated with a protective varnish (that conforms to a standard). Technically, areas can exist in which the function of components would be negatively influenced by a protective varnish, for example in the area of optical or also mechanical components, for example LED lenses or switches. Consequently, there can be areas in which a protective coating is completely refrained from. In these areas, relatively great distances of the components/conductor tracks are then implemented. In other areas of the main circuit board, components might be covered by other components, so that a protective varnish is not possible or only possible with difficulty. In these areas, too, for example under a display, components and conductor tracks can be structured in such a manner that they adhere to the prescribed distances without a protective varnish as required by standards. In total, the main circuit board can be structured, in a targeted manner, so that as many areas as possible are provided with a protective varnish, so that in these areas, the distances can be further reduced. Independent of this it should be noted that a distinction can be made between the distances between individual protection islands, on the one hand, and within the protection islands, on the other hand. As has been described, however, the possibility also exists of completely doing without a protective coating, for example a protective varnish, on the main circuit board.

A particular advantage of the implementation of a (separate) additional circuit board consists in that the additional circuit board—independently of the main circuit board—can be provided with a protective coating, for example can be provided or sheathed, in certain regions or entirely, with a protective coating. Thus, the possibility exists that the additional circuit board is completely encapsulated in an electrically insulating material or also the material is injection-molded around it. It can also be practical or sufficient to provide the additional circuit board with a coating merely on one circuit board side (entirely or in certain regions), for example with a suitable casting compound, so that the circuit board, for example, is encapsulated only on one side. In addition to the electrical insulation, the casting has the advantage that heat can be carried away over a large area by means of the casting compound. Heating of components that might possibly occur, which would bring about exceeding the surface temperature permitted for the explosion protection, is absorbed by the casting compound and thereby slowly given off at the casting compound, so that the surface temperature of the casting compound remains within the allowed limit. Furthermore, the casting compound—just like a protective varnish—allows the implementation of smaller distances between and sizes of conductor tracks and components.

In a possible, particularly advantageous embodiment, all the voltage regulators (for example three voltage regulators) are arranged on the additional circuit board. All the voltage regulators can be implemented spatially very close next to one another on the additional circuit board, so that all the voltage regulators can be equipped with one or more thermal cutoffs, for example a common thermal cutoff, in that, for example, a thermal cutoff is glued over all three voltage regulators. In the event of a failure and of overheating, the thermal cutoff triggers, so that the current to the device is switched off. As has already been mentioned, the additional circuit board can be encapsulated, in whole or in part, or encapsulated, for example, on the top, on which all of the components are affixed. Fundamentally, it can be sufficient to distribute the heat that results from the voltage regulators over the encapsulation of the circuit board, so that the encapsulation surface does not exceed the temperature allowed for the protection level. By means of the optionally additionally used thermal fuse, however, overly great heating of the casting mass itself can be prevented, so that in particular, it is avoided that the maximum permissible temperature of the casting mass, for example, is exceeded directly at a voltage regulator, and as a result the casting mass is damaged. This is because such damage of the casting mass is supposed to be prevented, so that property that is important for the explosion protection, that of air-tight exclusion of a gas mixture that is capable of ignition, is guaranteed.

In total, the possibility exists of configuring the distances of the conductor tracks and components in a variable manner. Preferably, it is provided that between individual circuit islands without a protective coating, a predetermined first minimum distance is implemented, which can amount to 1.5 mm, for example. Alternatively or supplementally, a second minimum distance can be implemented between individual circuit islands having a protective coating, which can amount to 0.5 mm, for example. Alternatively or supplementally, a third minimum distance can be implemented within a circuit island, which amounts to 0.2 mm, for example, wherein in this case, it does not matter whether a protective coating is implemented, since the power is limited, in any case, in the area of the circuit island.

The embodiment with a main circuit board, on the one hand, and an additional circuit board, on the other hand, furthermore has the additional advantage that all the components that are required for the function of a lubricant dispenser, independently of the use in areas at risk of explosion, are implemented on the main circuit board, and that on the additional circuit board, the additionally required components are provided, which are required for the operation of the lubricant dispenser in areas at risk of explosion.

Consequently, the main circuit board can, in a preferred embodiment, also be technically fully or essentially capable of functioning even without the additional circuit board, but then for use in areas not at risk of explosion. The additional circuit board can, for example, be arranged "piggyback" on the main circuit board, for example plugged into and/or soldered onto the main circuit board. Since the current limitation and the voltage regulation have particular significance (for example for use in explosion protection), the current-limiting device and the voltage regulation device are preferably arranged entirely or partly on the additional circuit board. The current-limiting device is relevant, above all, for the explosion protection version of the circuit assembly, so that it can be arranged entirely on the additional circuit board. A voltage regulation can also be advantageous, if applicable, if the lubricant dispenser is not supposed to be operated in areas protected against explosion. Then, however, multiple redundancy of the voltage regulation device is not necessary. For this reason, optionally at least one voltage regulator can be arranged on the main circuit board, while the further voltage regulators for redundancy can be arranged on the additional circuit board. Preferably, however, all the voltage regulators (which are necessary for the explosion protection variant) are arranged on the additional circuit board, so that in this case, no voltage regulator is provided on the main circuit board. However, if this circuit board is optionally supposed to be operated in an area not protected against explosion, then the additional circuit board is eliminated, and instead, the main circuit board is optionally equipped with a voltage regulator.

In a further possible embodiment, it can be advantageous to equip the control circuit-board assembly with a circuit board detection, which automatically recognizes whether an additional circuit board is provided, for example set onto or soldered onto the main circuit board or connected to the main circuit board. This can be implemented, for example, in that a pin of the microcontroller is operated with a Pull-Up resistor. By means of connecting or soldering the additional circuit board on, this pin is laid to ground, and thereby the (soldered-on) additional circuit board is recognized. This detection is preferably integrated into the programming of the microcontroller, for example into the software, in other words the software recognizes whether the additional circuit board is soldered on. This has the advantage that as the result of this detection, a corresponding parameter adaptation of the software can take place. In this way, for example, possible special functions in the explosion protection variant can be automatically activated, or the method of operation can be adapted to whether or not the additional circuit board is implemented, or whether or not the circuit board assembly is intended for the explosion protection sector. Thus, for example, functionality is made available, in which specific parameters for the explosion protection variant are adhered to. For example, the maximum running time could be limited, if the capacity of the battery pack is not able to cover the additional current requirement for the electronics necessary for the additional explosion protection. By means of the automatic detection, no separate software needs to be created for this case, because the parameter adaptation takes place automatically.

As has already been explained, the circuit assembly contains multiple circuit islands, in which the power is preferably limited, in each instance. Such a circuit island can, for example, hold the microcontroller as a central component, which is power-limited, for example, by way of a series resistor. Further components can be integrated into this circuit island as functional components, which, however, are supplied with voltage only by way of the microcontroller, and are not themselves connected to the battery or the voltage regulation device, so that these additional components themselves do not have to be limited in power. In this regard, reference is made to the figure description.

Further circuit islands can contain functional components, in each instance, which are connected to the reduced and regulated battery voltage, in other words to the voltage regulation device, and additionally stand in connection with the microcontroller. In the case of these components, it is if, for example, a power-limiting resistor or series resistor is provided between the circuit island and the microcontroller.

Further details and optional embodiments of the circuit islands and their parts are explained, as an example, in the figure description.

A significant component of the lubricant dispenser is the electromechanical drive, since according to the invention an electromechanical lubricant dispenser is implemented for use in surroundings potentially at risk of explosion. The electromechanical drive is preferably configured as a direct-current motor or equipped with such a direct-current motor. Particularly preferably, a brushless direct-current motor (BLDC motor) is used as the drive. This motor variant does without the brushes provided in the case of other motor types, so that the formation of brush fire is prevented. This is particularly advantageous because of the use in surroundings potentially at risk of explosion, because in these surroundings, the energy of even a small spark can be sufficient to trigger an explosion. Furthermore, BLDC motors have the advantage that the inductivity is very much lower than in the case of a conventional brush motor. The use of the BLDC motor makes it possible to use higher voltages in the entire electronics, and higher currents are allowed to flow than when using a brush motor. This means that a motor having a high torque is used, at low power consumption.

Optionally, the lubricant dispenser can be configured for wireless communication. For this purpose, the circuit assembly can be equipped with a communication module, for example a radio module, which is arranged, for example, on the main circuit board (for example as a separate circuit island). The possibility of wireless communication, for example by radio, is advantageous, in particular in areas at risk of explosion, since the lubrication locations at which the lubricant dispensers are used can frequently be reached only with difficulty, and frequently special requirements with regard to work safety also exist. Possible wireless protocols are, for example, a Bluetooth protocol, in other words the wireless module can be configured as a Bluetooth module, for example as a Bluetooth-Low-Energy module (BLE). Alternatively, however, other wireless modules or other transmission protocols are also possible, for example WLAN, LPWAN (for example LoRa, SigFox). By way of the wireless communication, the possibility exists of performing maintenance on the lubricant dispenser, calling up data, or, if applicable, even undertaking settings. It is true that the lubricant dispensers can be equipped with a display and setting possibilities on the lubricant dispenser. In addition, however, it can be advantageous to also transmit the data to a suitable terminal, for example a smartphone, tablet or a computer, so that data can be read from there and, if applicable, settings on the lubricant dispenser can also be changed. In this regard, it is possible to do without hard-wired connections, which are problematical, in particular, in areas at risk of explosion. The battery-operated lubricant dispenser with wireless communication has the advantage that no intervention in the energy supply of the system is necessary. The user can call up various data wirelessly from the lubrication system, from a safe distance, for example using an explosion-protected smartphone. Vice versa, the personnel can also send data to the lubrication system wirelessly, for example acknowledge problems or trigger special dispensing actions. Using gateways, the possibility can optionally be implemented that the personnel does not necessarily have to be in the vicinity of the lubrication location, in other words communication is possible even beyond the Bluetooth range. Data can also be called up directly from the control center of the system.

In a preferred embodiment, the circuit assembly, for example the main circuit board, is equipped with a communications module, which is connected to the microcontroller, on the one hand, and to the regulated battery voltage or the operating voltage, on the other hand. Such a communications module, too, for example a Bluetooth module, can be implemented as a separate circuit island. In this case, power limitation by way of a series resistor might not be possible, since the module requires a relatively high current for a corresponding transmission power, in other words the module cannot be limited in terms of power. In this case, it can be practical to equip such a circuit island with an additional fuse of its own, for example a thermal cutoff, which triggers at a specific triggering temperature. Consequently, protection islands can also be implemented that are not power-limited by way of a series resistor, but rather are each equipped with their own safety mechanisms, for example thermal cutoffs.

Something similar holds true, for example for a protection island that holds the motor circuit. In the case of the motor, a power limitation by way of a series resistor might not be possible. However, it must be guaranteed that the energy that is stored in the coils of the motor is limited. This can be done by way of the current limitation as described. The power limitation by way of a series resistor is not possible in the case of a motor, for example a BLDC motor, for example because due to the high current of the motor, such a great voltage drop would occur at a series resistor that the remaining residual voltage would no longer be sufficient for correct operation of the motor. Furthermore, it can be practical to use a BLDC motor without Hall sensors for determining the position of the rotor, since it might not be possible to operate Hall sensors in a low voltage range. The use of motors having Hall sensors is only possible at higher voltages. When starting a BLDC motor without Hall sensors, specific conditions or requirements must be taken into consideration. Thus, it could be possible to turn the motor on either directly by way of the microcontroller (with a subsequent driver stage), in other words turning the motor on is then regulated by way of software. Alternatively, a corresponding BLDC-motor controller is used. This motor controller receives a PWM signal from the microcontroller for a speed default value. Turning on the motor, including the driver stage, is preferably integrated into the motor controller, in its entirety. The motor controller issues an rpm signal to the microcontroller for monitoring the revolutions per minute of the motor by means of the microcontroller. The motor controller itself can, in turn, be power-limited by way of a series resistor. Alternatively, however, the possibility also exists of protecting the motor controller against overly high heating by way of a thermal cutoff, so that in this case, it is possible to do without a power-limiting resistor.

In total, by means of the measures according to the invention, a lubricant dispenser is made available, which is equipped with an electromechanical drive, on the one hand, and which can be used in surroundings potentially at risk of explosion, on the other hand. By means of the measures described, voltages and current strengths that flow on a circuit board are limited. Temperature increases are limited or prevented. Sparks are prevented, or the spark energy is limited. If errors occur, the explosion-relevant circuit regions are equipped with protective mechanisms, preferably with multiple, preferably triple redundancy.

Depending on the design, it is possible to achieve an explosion protection certification for the desired level, for example for the gas group IIB or even IIC, by means of the measures according to the invention.

Furthermore, the invention also relates to a control circuit-board assembly of the type described, which is set up for the lubricant dispenser described, in the manner described. Consequently, independent protection is also being claimed for the control circuit-board assembly, which preferably consists of a main circuit board and an additional circuit board, and in which it is particularly important that multiple, separate circuit islands are configured as explosion protection islands.

Figure 3:
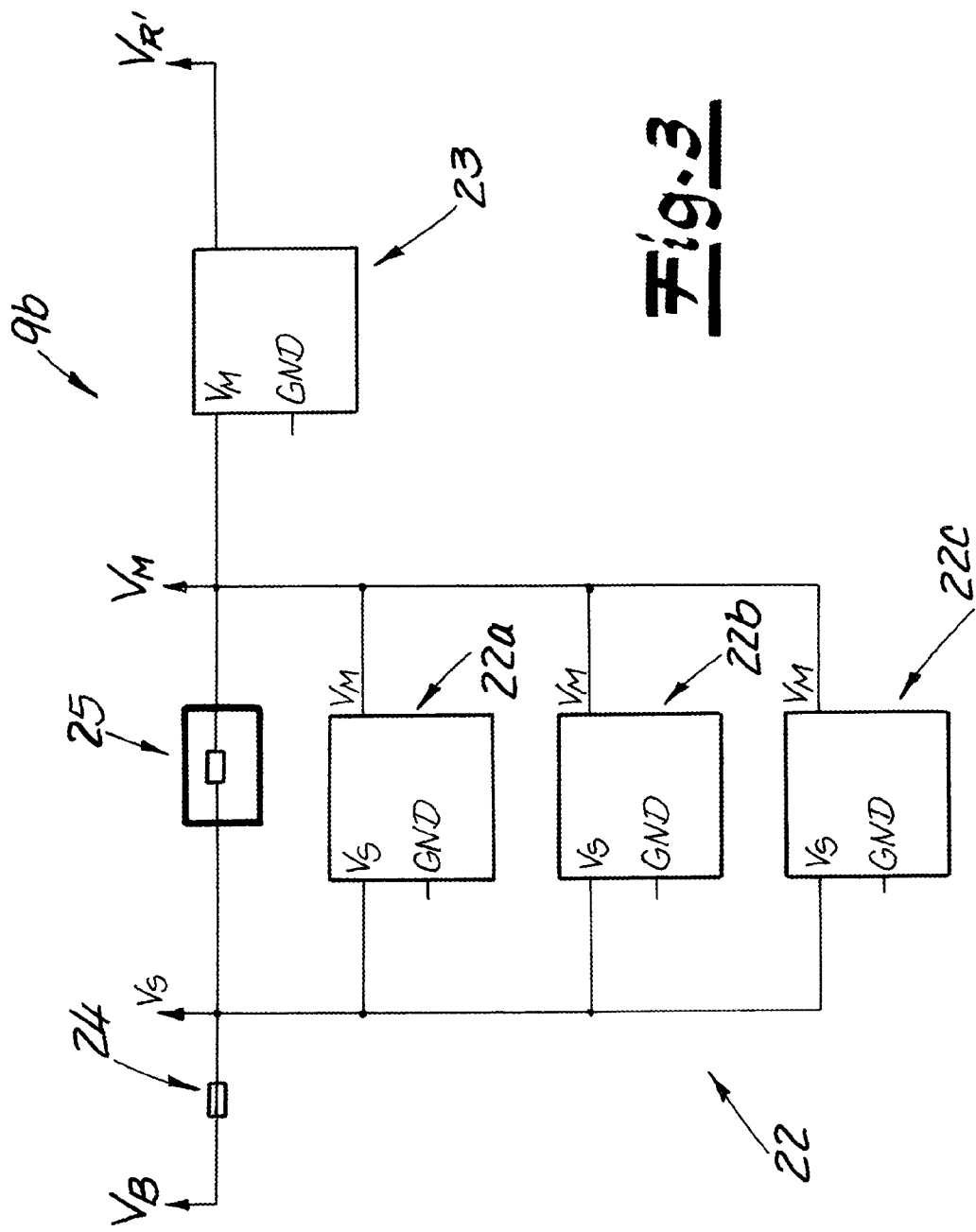
Figure 4:
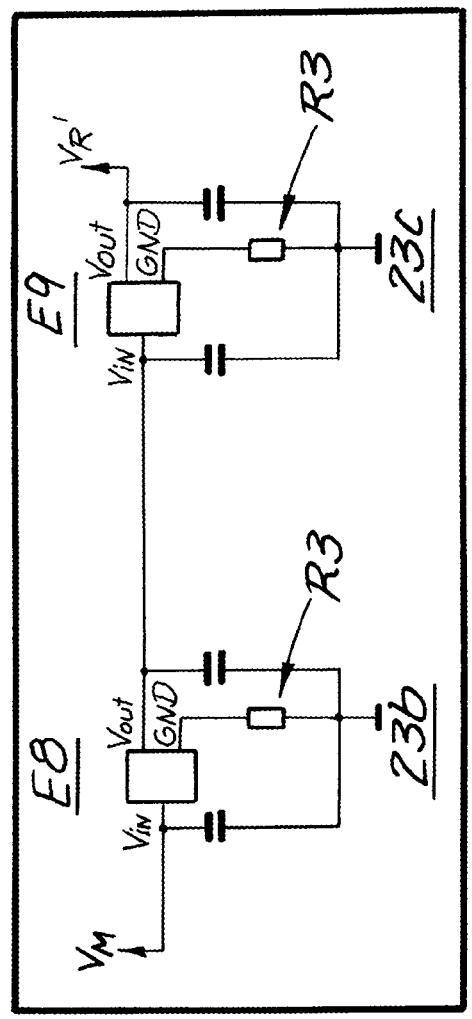
Figure 5:
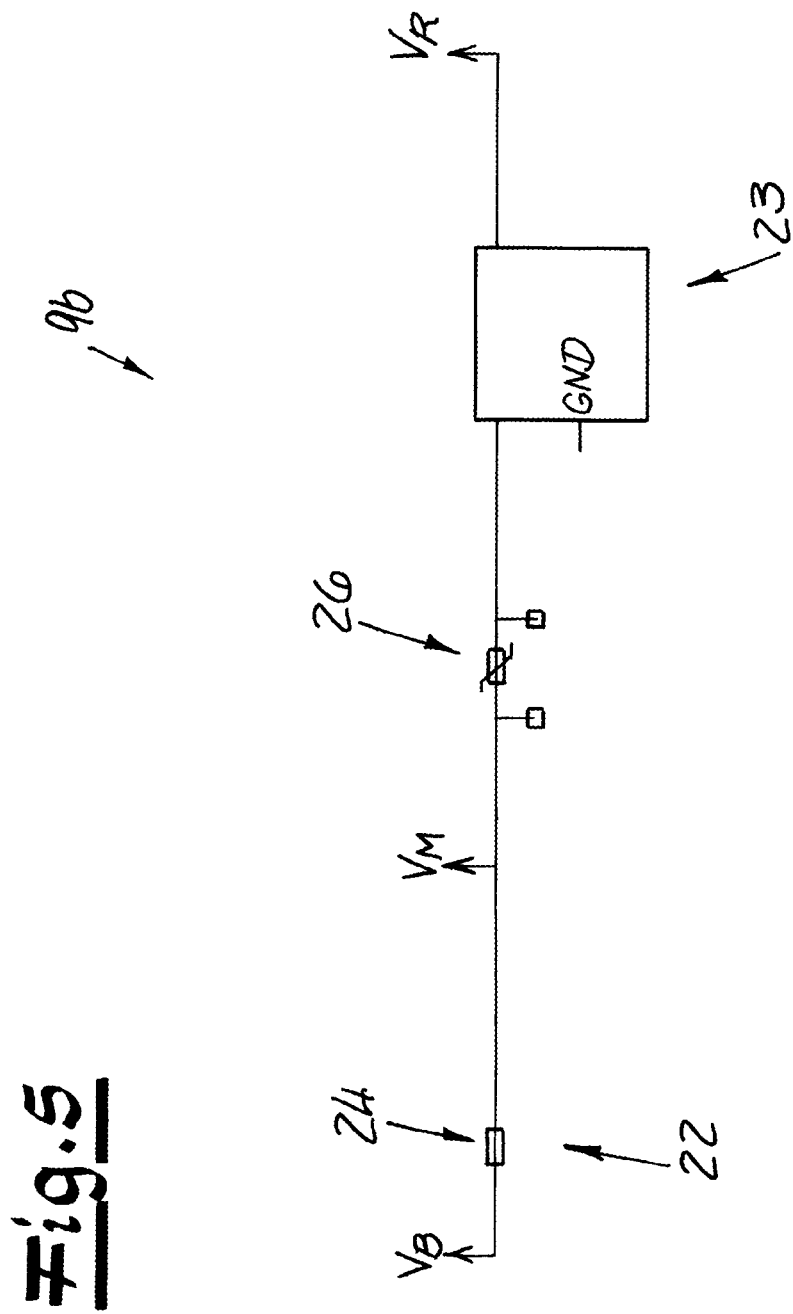
Figure 6:
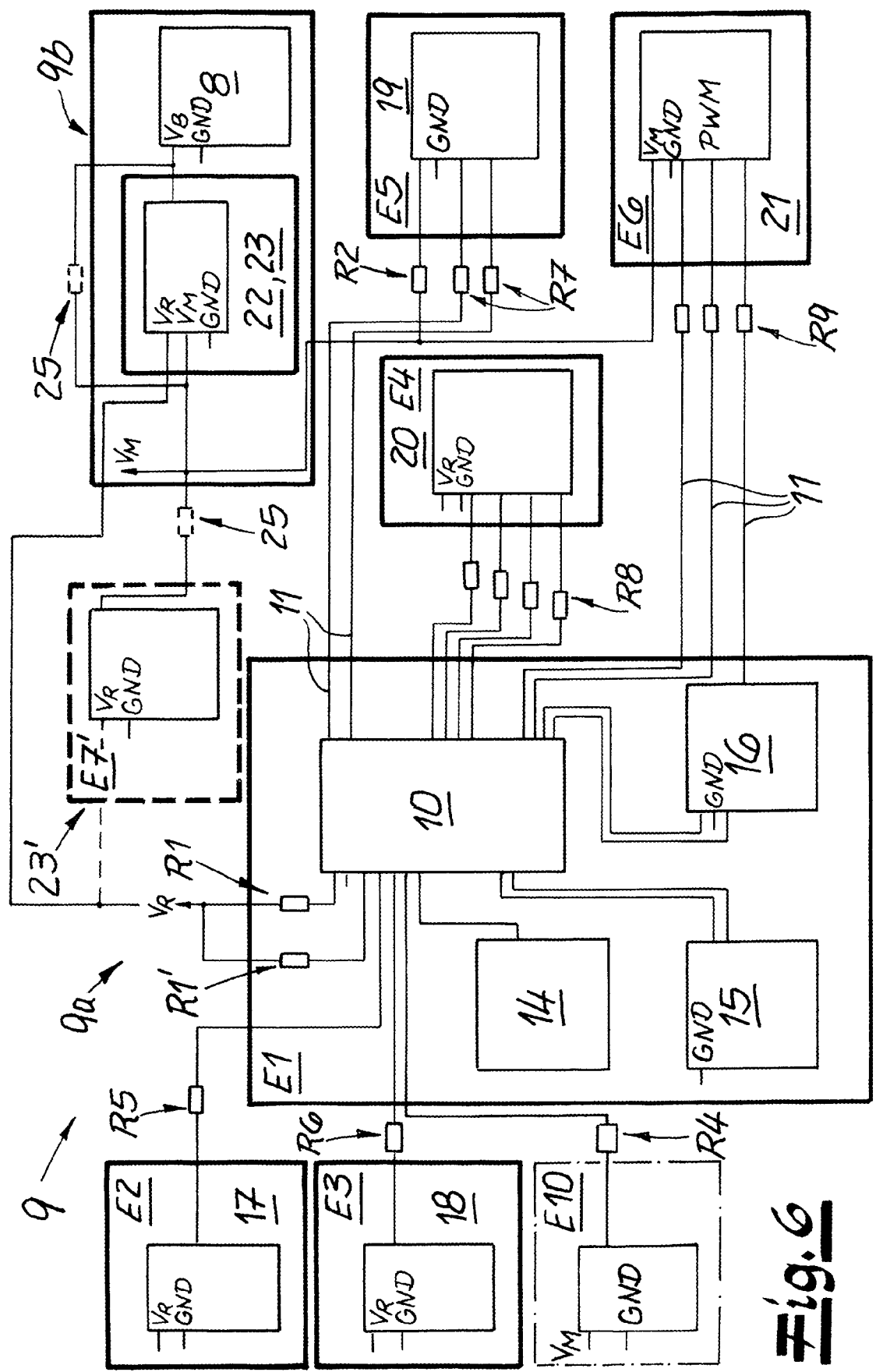
Figure 7:
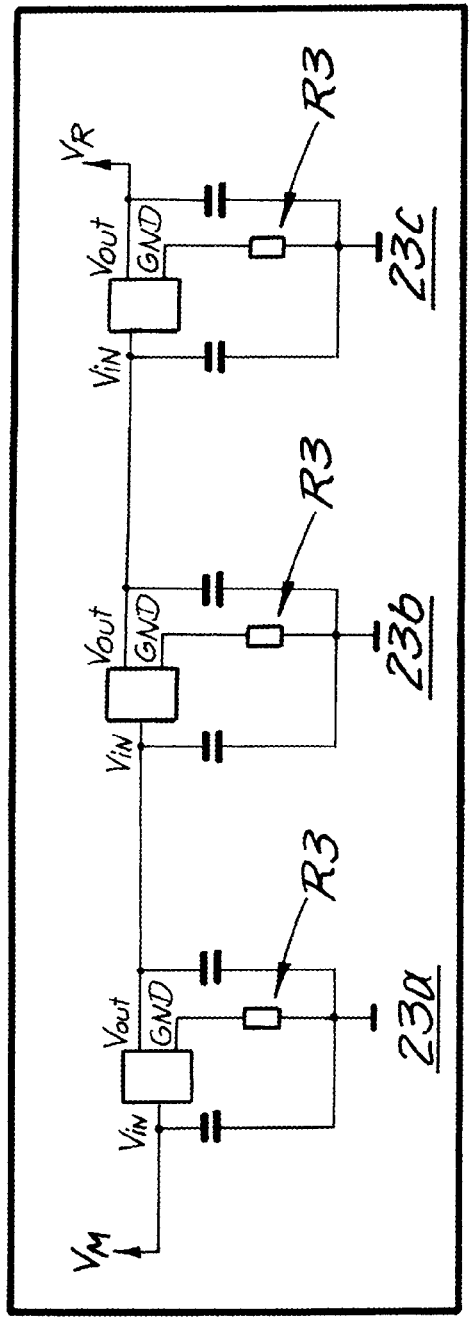

In the following, the invention will be explained in greater detail using drawings that merely represent an exemplary embodiment. These show:

FIG. 1 a lubricant dispenser in a simplified representation,

FIG. 2 a block diagram of a circuit assembly of the lubricant dispenser according to FIG. 1, FIG. 3 a block diagram of an additional circuit board of the circuit assembly according to FIG. 2, FIG. 4 the voltage regulators of the additional circuit board according to FIG. 3, FIG. 5 an alternative embodiment of the additional circuit board according to FIG. 3 with a simplified current limitation, FIG. 6 an alternative embodiment of a circuit assembly according to FIG. 2, FIG. 7 an alternative embodiment of the voltage regulation device on the additional circuit board.

In the figures, a lubricant dispenser 1 is shown, which is intended for use in areas potentially at risk of explosion. The lubricant dispenser 1 serves for automated lubrication of, for example, machine and system parts, and can preferably be used for individual point lubrication. Fundamentally, however, use for multiple point lubrication is also possible. The fundamental structure of the lubricant dispenser 1 shown as an example in the figures includes a lubricant reservoir 2 in the embodiment as a lubricant cartridge 2, which is filled with lubricant and has an outlet opening 3 for the lubricant. An actuation element 4 is arranged in the cartridge 2, in the embodiment as a piston 4 for pressing the lubricant out of the outlet opening 3. This piston 4 is arranged on a rotatable spindle 5. The lubricant cartridge 2 is connected to a drive 7 arranged in a housing 6, wherein this drive 7 is configured as an electromechanical drive. In the exemplary embodiment, this is an electric motor drive or an electric motor 7, in particular a direct-current motor, which is preferably configured as a brushless direct-current motor. The motor 7 drives the spindle 5, by way of which the lubricant is pressed out of the cartridge 2.

For the energy supply of the lubricant dispenser 1, a battery 8 or a battery arrangement having multiple batteries 8, which makes a direct voltage available as the battery voltage $V_B$ (for example 4.5 V) is provided. Furthermore, a control circuit-board assembly 9 is provided, which is also arranged in the housing 6. This control circuit-board assembly 9 has an electronic circuit assembly having at least a central microcontroller 10 and additional electronic functional components, as well as conductor tracks 11. The control circuit-board assembly 9 is connected to the battery 8, on the one hand, and to the drive 7, on the other hand. The control circuit-board assembly 9 is set up for controlling the drive 7, and thereby for controlling the lubricant dispenser 1. For this purpose, the lubricant dispenser 1 is equipped with different electronic components that are arranged on the control circuit-board assembly or connected to it. In particular, a display apparatus 12 and/or setting possibilities 13, for example setting push buttons or the like, can be provided, so as to be able to undertake and/or read off changes in the configuration of the lubricant dispenser 1, for example dispensing intervals or the like. Furthermore, the control circuit-board assembly can be equipped with or connected to sensors, for example a temperature sensor.

The control circuit-board assembly 9 is configured, according to the invention, for the operation of the lubricant dispenser in surroundings potentially at risk of explosion, specifically for "Zone 0" surroundings. For this purpose, voltages and current strengths that flow on the circuit-board assembly are limited. Temperature increases must be limited or prevented, and furthermore sparks must be prevented or the spark energy must be limited.

For this purpose, it is provided, according to the invention, that the electronic circuit assembly is subdivided into multiple circuit islands E1 to E9, which are also referred to as explosion protection islands. At least some of these circuit islands are power-limited (separately), in each instance for example by means of power-limiting resistors, for example series resistors R1, R1', R2, R3.

In FIGS. 2 and 6, the circuit assembly is shown, and it can be seen that a plurality of protection islands are formed, which are referred to, for example, as E1 to E7 as well as E10.

An explosion protection island E1 comprises the microcontroller 10 as well as additional functional components, for example an optical display, for example an LCD display 14, a temperature sensor 15 and/or a filter unit 16, for filtering or smoothing of the motor current. Further separate circuit islands E2-E6 that are provided are, for example, an illumination 17 for the (LCD) display, a radio module, for example a Bluetooth module 18, an LED assembly 20, a circuit board part 19 for measuring the battery voltage, as well as a motor controller or the motor connection device 21.

It is particular importance that the circuit islands that are connected to the battery or are supplied with the battery voltage are configured in such a manner that the maximum possible power within the corresponding circuit island is limited, in each instance, specifically, for example, by means of a power-limiting resistor, for example a series resistor. Circuit islands without power limitation can be equipped with a thermal cutoff. This will still be discussed below.

It is furthermore of particular importance that the circuit assembly according to the invention is provided with a current-limiting device 22, which limits the total energy within the circuit assembly as a whole. Furthermore, the circuit assembly is provided with a voltage regulation device 23, which reduces the battery voltage $V_B$ to a regulated operating voltage $V_R$.

In the exemplary embodiments shown, the circuit assembly has a main circuit board 9a, on the one hand, and an additional circuit board 9b arranged on the main circuit board 9a, on the other hand, which are indicated in FIGS. 2 and 6, top right, and shown in FIGS. 3 and 5. The additional circuit board 9b, in particular, holds the current-limiting device 22, which can be optionally configured with multiple redundancy, according to FIG. 3, and for this purpose comprises three current-limiters 22a, b, c, which are switched in parallel. The voltage regulation device 23 is also configured with multiple redundancy. For this purpose, it has three voltage regulators 23a, b, c, which are switched in series. In this regard, a comparison of FIGS. 2 and 4 shows that of these three voltage regulators (in the embodiment according to FIGS. 2 and 4), one voltage regulator 23a is arranged on the main circuit board 9a, while two further voltage regulators 23b, c are arranged on the additional circuit board 9b. In this regard, the voltage regulator 23a on the main circuit board 9a and the voltage regulators 23b, 23c on the additional circuit board 9b each form a separate explosion protection island E7, E8, E9.

In FIGS. 3 and 5, it can be seen that the battery voltage $V_B$ of 4.5 V, for example, is connected to the current-limiting device 22 and voltage regulation device 23. By way of the voltage regulation device 23, this battery voltage is reduced to the regulated operating voltage $V_{R'}$ or $V_R$ of 3.3 V, for example. In the circuit assembly, there are consequently three voltage specifications, for one thing the output voltage $V_B$ of the battery, at 4.5 V, arranged behind the current-limiting devices and an additional melt fuse, for another thing the non-reduced main voltage $V_M$ at also 4.5 V, and finally the reduced, regulated operating voltage $V_{R'}$ or $V_R$ at 3.3 V. Furthermore, the voltage $V_S$, which drops over the shunt resistor 25, is shown.

In FIG. 2, it can be seen that the reduced operating voltage VR', delivered by the additional circuit board 9b, is still passed over the third voltage regulator 23a, at the output of which the reduced operating voltage VR, which is relevant for the electronic circuit board, is available. According to FIG. 2, for example, this provides the explosion protection island with the microcontroller and the LCD illumination. In this regard, it can be seen that these explosion protection islands, which are connected to the reduced battery voltage, are power-limited by way of resistors R1, R1', R2, R3. Thus, the explosion protection island E1 of the microcontroller 10 can be power-limited by way of at least one power-limiting series resistor, for example the series resistor R1. In the exemplary embodiment shown in FIGS. 2 and 6, the microcontroller is connected to the reduced, regulated operating voltage VR by way of two power-limiting series resistors R1, R1'. In this regard, one of the connectors supplies the digital parts of the microcontroller 10, and the other one supplies the analog parts, for example the analog-digital converter, with the voltage. Within the explosion protection island E1 of the microcontroller 10, the functional components furthermore provided there are not directly connected with the operating voltage, but rather merely with the microcontroller 10, so that these functional components do not have to be separately power-limited by way of series resistors. Furthermore, it can be seen that the explosion protection island E5, for example, is power-limited by way of the series resistor R2. The explosion protection islands E2, E4 and E10 are also power-limited, specifically, in each instance, by way of a series resistor, which is not shown in the figures.

The voltage regulators 23a, b, c themselves are also power-limited by way of resistors R3, so that the two voltage regulators 23b, c arranged on the additional circuit board 9b, as well as the voltage regulator 23a arranged on the main circuit board 9a, also form a separate explosion protection island E7, E8, E9, in each instance.

The aforementioned resistors R1, R1', R2 and R3 are series resistors, which limit the power of the circuit island assigned to them, in each instance. Furthermore, the resistors R4, R5, R6, R7, R8 and R9 are shown in the drawings; these are not power-limiting series resistors, but rather resistors that are arranged between the individual explosion protection islands and, in this way, implement power limitation between the explosion protection islands, which are connected to one another. In the exemplary embodiment shown, this particularly serves for protection of the central explosion protection island E1 or for protection of the microcontroller 10, because the other explosion protection islands are connected to this explosion protection island E1 by way of the resistors R4, R5, R6, R7, R8 and R9. In this regard, in a schematically simplified manner, at some connections only a single intermediate resistor R4, R5 or R6 is shown in the drawing, and at some connections groups of intermediate resistors R7, R8 and R9 are shown in the drawing as examples, because there multiple connection lines between the explosion protection islands are also shown in the drawing.

Furthermore, in FIGS. 3 and 5 it can be seen that the current-limiting device 22 additionally comprises a melt fuse 24.

In FIG. 5, an alternative embodiment of the current-limiting device 22 is shown, which can be used alternatively also in connection with FIG. 2 or also FIG. 6. FIG. 5 shows the additional circuit board 9b with the voltage regulation device 23 and a current-limiting device 22, once again in a simplified form, wherein this current-limiting device is not configured to be active, and consequently it does not have any active current limiters. Instead, the current-limiting device 22 merely consists of a melt fuse 24, which limits the total current.

While FIG. 4, in connection with FIG. 2, shows an embodiment in which merely part of the voltage-limiting device 23 is arranged on the additional circuit board, FIGS. 6 and 7 show an alternative, advantageous embodiment, in which the entire voltage-limiting device 23 is arranged on the additional circuit board, with all (three) voltage limiters 23a, 23b, 23c. The embodiment of the main circuit board shown in FIG. 6 differs from the embodiment shown in FIG. 2, above all, in that no voltage limiter is arranged on the main circuit board 9a (in explosion protection operation), since all the voltage limiters are arranged on the additional circuit board. Consequently, the main circuit board according to FIG. 6 can be equipped with the additional circuit board according to FIG. 3, wherein the voltage regulation device 23 merely shown in simplified form in FIG. 3 is then equipped, according to FIG. 7, with all the voltage limiters 23a, 23b, 23c. The additional circuit board can be implemented, also in the case of the embodiment of the main circuit board according to FIG. 6, optionally either with the active current limitation according to FIG. 3 or with the simplified current limitation by way of the melt fuse according to FIG. 4.

In this regard, it is indicated in FIG. 6 (with a broken line) that a voltage regulation device 23' can also be arranged on the main circuit board 9a. However, this only holds true for the case that the main circuit board 9a is supposed to be used without an additional circuit board 9b for non-explosion protection areas. Consequently, the main circuit board 9a is equipped with a voltage regulation device 23' or E7' only in the non-explosion variant. In the explosion protection variant, the voltage regulation device 23' is absent on the main circuit board 9a according to FIG. 6, since all the voltage regulators are arranged on the additional circuit board in the case of this embodiment, as shown in FIG. 7.

In order to be able to automatically activate possible special functions in the explosion protection variant of the circuit board, detection can be implemented, which automatically detects whether the additional circuit board is soldered on. For this purpose, a pin of the microcontroller 10 can be operated with a Pull-Up resistor. By means of soldering the additional circuit board on, this pin is laid to ground. Thereby the soldered-on additional circuit board is automatically detected (by way of the software that is stored in the memory of the microcontroller).

In FIG. 5, it is furthermore indicated that the additional circuit board 9b and, in particular, the voltage limiting device 23, can be equipped with a thermal cutoff 26.

Optionally, a radio module, for example a Bluetooth module 18, is provided on the main circuit board, which module also can be configured as a separate explosion protection island E3. In this regard, it can be seen in FIGS. 2 and 5 that this explosion protection island E3 or this radio module 18 is not power-limited by way of a series resistor. Since the module requires a relatively high current for a corresponding transmission power, a power limitation by way of a series resistor is not provided. However, an additional thermal cutoff is arranged in the explosion protection island, which cutoff is triggered at a specific triggering temperature, so that in the case of this explosion protection island, it is possible to do without a power limitation by way of a series resistor. The thermal cutoff is glued, for example by means of a temperature-conductive adhesive, onto the surface of the radio module 18. No details are shown. The Bluetooth module 18 shown in the drawing is merely a possible option of a radio module. Radio modules having a different transmission protocol can also be used. The possibility of wireless communication stands in the foreground.

The explosion protection island E6 for the motor connection or the motor controller 21 is also not power-limited by way of a series resistor. Here, too, a thermal cutoff, for example by means of a temperature-conductive adhesive, is glued onto the surface of the circuit board or of the circuit board section. In this regard, for example, a BLDC motor without Hall sensors is used for determining the position of the rotor, since such a motor can work without Hall sensors at low voltages. The control takes place by way of a BLDC motor controller. This motor controller 21 receives a PWM signal from the microcontroller 10 for a speed default value. The control of the motor, including the driver stage, is completely integrated into the motor controller 21. The motor controller 21 itself is protected in the manner described, with a thermal cutoff, to prevent overheating. Furthermore, it is guaranteed that the energy that is stored in the coils of the motor is limited, so as to prevent temperature increases and spark formations. This is done by way of the current limitation as described, which is provided on the additional circuit board, so that for this explosion protection island, no power limitation by way of an additional series resistor is necessary.

The current-limiting device 22 implemented in the exemplary embodiment, on the additional circuit board 9b, limits the current of the entire circuit board 9 at a central location. As a result, no further current-limiting measures of any kind have to be provided in the other or individual circuit board parts or explosion protection islands. The power-limiting resistors R1, R1', R2, R3 of the explosion protection islands serve, independently of the current-limiting device, for the purpose that in the event of a failure of an integrated module, for example in the event of a short-circuit that could occur in the module, this module is not stressed beyond its maximum capacity. Fundamentally, a defect could also occur in the supply line to the power-limiting resistors, in that a short-circuit to ground occurs there. Fundamentally, this defect could be prevented by means of corresponding distances of the conductor tracks from ground, in other words what is called "non-susceptibility to failure of the conductor track with regard to short-circuit." By means of the use of the central current-limiting device, however, it is no longer necessary to provide for these measures.

In connection with circuit assemblies for areas at risk of explosion, the distances between components and conductor tracks, which are not allowed to go below specific minimum distances, so as to prevent short-circuits, which can form, for example, due to conductive dust particles, are of particular importance. In this connection, the embodiment of the circuit assembly with multiple separate circuit islands is particularly advantageous, because within the circuit islands, smaller distances can be implemented than between the circuit islands. According to the invention, it is consequently provided that the distances of the conductor tracks between individual circuit islands do not go below a predetermined minimum distance, wherein this minimum distance is greater than the distance of the conductor tracks within the circuit islands. A further improvement can optionally be achieved—depending on the level of protection aimed at—in that the circuit assembly is provided, at least in certain regions, with an electrically insulating protective coating, since the permissible distances between the conductor tracks can be further reduced by means of such protective coatings. In the region of the main circuit board, if necessary, a protective varnish can be used, in other words the circuit assembly on the main circuit board can be coated, in certain regions, with a protective varnish. In this regard, specific regions are left out, for example, in other words in specific regions, no protective varnish is applied, since the protective varnish can lead to impairments in the case of specific components or the application of a protective varnish is not possible spatially in specific regions. However, it is also possible to do without a protective varnish entirely on the main circuit board.

On the main circuit board or in regions of the main circuit board in which no protective varnish is provided, a predetermined first minimum distance von 1.5 mm, for example, will not be fallen short of, for example. This relates, for example, to the regions between individual circuit islands that are exposed, without any protective varnish.

In the regions between individual circuit islands that are provided with a protective coating, a second minimum distance of 0.5 mm, for example, is adhered to.

Within the circuit islands, the minimum distance can be further reduced, so that within the circuit islands, a third minimum distance of 0.2 mm, for example, is adhered to, specifically independent of whether or not a protective coating is provided.

The total safety is increased even further in that the additional circuit board 9b is partially provided or sheathed with a protective coating, for example encased in a protective coating. Thus, it can be practical to encase the additional circuit board merely on one side. This is not shown in the drawings.

In the exemplary embodiment shown, having a main circuit board 9a and an additional circuit board 9b, it is furthermore advantageous that the circuit assembly can be used even without the additional circuit board, specifically for uses outside of areas at risk of explosion. In this case, the current-limiting device is not used. Nevertheless, a single voltage regulator is provided on the main circuit board, which regulator consequently no longer needs to be configured with multiple redundancy. The circuit assembly according to FIG. 2 consequently functions even without the additional circuit board, wherein in this case, the bridges 25 shown in FIG. 2 have to be fitted. In the case of the circuit assembly according to FIG. 6, a voltage limiter 23' is provided for use outside of areas at risk of explosion, which limiter is not arranged on the main circuit board 9*a* in the explosion protection variant, since all the voltage limiters in this embodiment according to FIGS. 6 and 7 are arranged on the additional circuit board. In this case, too, the bridges 25 shown in FIG. 6 are fitted.

Furthermore, both the embodiment according to FIG. 2 and the embodiment according to FIG. 6 show an additional block that can be optionally implemented, or an additional circuit island E10, which serves for a battery differentiation. Using this circuit island, which is power-limited by way of a resistor, not shown, the battery pack is burdened with a specific current, in a controlled manner, specifically with the burden caused by control of the motor and of the LEDs. By way of the technology-related voltage collapse, it can thereby be determined which battery type has been inserted, for example whether an alkali battery or a lithium battery or battery pack has been inserted. By way of the resistor R4, the aforementioned power limitation between the protection island E10 and the protection island E1 takes place.

The invention claimed is:

1. A lubricant dispenser (1) comprising:
a lubricant reservoir (2),
an electromechanical drive (7) that acts on at least one actuation element (4) for discharging lubricant from the lubricant reservoir (2),
a battery (8) that provides a battery voltage (VB),
a control circuit-board assembly (9) that comprises at least one main circuit board (9*a*) having an electronic circuit assembly comprising at least one central microcontroller (10) and additional electronic functional components as well as conductor tracks (11),
wherein
the electronic circuit assembly is subdivided into a plurality of circuit islands (E1 to E9), or has multiple circuit islands (E1 to E9),
wherein some or all of the circuit islands are each power limited,
wherein the circuit assembly is provided with or connected to a voltage regulation device (23), which reduces the battery voltage (VB) to a regulated operating voltage (VR),
wherein the voltage regulation device (23) is designed with multiple redundancy and comprises multiple voltage regulators (23*a, b, c*), and
wherein the voltage regulator or the voltage regulators (23*a, b, c*) are each separately power-limited, as a separate circuit island (E7, E8, E9).

2. The lubricant dispenser according to claim 1, wherein one or more of the circuit islands are power-limited by means of at least one current-limiting resistor (R1, R1', R2, R3).

3. The lubricant dispenser according to claim 1, wherein one or more of the circuit islands are each equipped with a thermal cutoff, which is attached to the circuit board.

4. The lubricant dispenser according to claim 1, wherein the electromechanical drive (7) is configured as a direct-current motor or comprises such a motor.

5. The lubricant dispenser according to claim 1, wherein the distances of the conductor tracks (11) between individual circuit islands do not drop below a predetermined minimum distance.

6. The lubricant dispenser according to claim 1, wherein the circuit assembly is provided with or connected to a current-limiting device (22) that limits the total energy within the entire circuit assembly.

7. The lubricant dispenser according to claim 6, wherein the current-limiting device (22) is designed with multiple redundancy and comprises multiple current-limiters (22*a, b, c*).

8. The lubricant dispenser according to claim 6, wherein the current-limiting device (22) additionally comprises a fuse (24).

9. The lubricant dispenser according to claim 1, wherein the circuit assembly in a circuit island (E3), comprises a communication module (18) for wireless communication.

10. A lubricant dispenser (1) comprising:
a lubricant reservoir (2),
an electromechanical drive (7) that acts on at least one actuation element (4) for discharging lubricant from the lubricant reservoir (2),
a battery (8) that provides a battery voltage (VB),
a control circuit-board assembly (9) that comprises at least one main circuit board (9*a*) having an electronic circuit assembly comprising at least one central microcontroller (10) and additional electronic functional components as well as conductor tracks (11),
wherein the electronic circuit assembly is subdivided into a plurality of circuit islands (E1 to E9), or has multiple circuit islands (E1 to E9),
wherein some or all of the circuit islands are each power limited, and
wherein the control circuit-board assembly (9) comprises, in addition to the main circuit board (9*a*), an additional circuit board (9*b*) connected to the main circuit board.

11. The lubricant dispenser according to claim 10, wherein the current-limiting device (22) is arranged on the additional circuit board (9*b*), wherein the current-limiting device (22) limits the current that flows into the main circuit board (9*a*).

12. The lubricant dispenser according to claim 10, wherein the voltage regulation device (23) is arranged, in part or completely, on the main circuit board, and/or is arranged, in part or completely, on the additional circuit board (9*b*), wherein one or more voltage regulators (23*b, c*) are arranged on the additional circuit board (9*b*).

13. The lubricant dispenser according to claim 12, wherein at least one voltage regulator (23*a*) is arranged on the main circuit board (9*a*), and one or more voltage regulators (23*b, c*) are arranged on the additional circuit board (9*b*).

14. The lubricant dispenser according to claim 12, wherein all the voltage regulators (23*a*, 23*b*, 23*c*) are arranged on the additional circuit board (9*b*).

15. The lubricant dispenser according to claim 12, wherein all the voltage regulators (23*a, b, c*) on the additional circuit board (9*b*) are equipped with a thermal cutoff.

16. A lubricant dispenser (1) comprising:
a lubricant reservoir (2),
an electromechanical drive (7) that acts on at least one actuation element (4) for discharging lubricant from the lubricant reservoir (2),
a battery (8) that provides a battery voltage (VB),
a control circuit-board assembly (9) that comprises at least one main circuit board (9*a*) having an electronic circuit assembly comprising at least one central microcontroller (10) and additional electronic functional components as well as conductor tracks (11),
wherein the electronic circuit assembly is subdivided into a plurality of circuit islands (E1 to E9), or has multiple circuit islands (E1 to E9),
wherein some or all of the circuit islands are each power limited, and wherein the circuit assembly is provided, in certain regions or entirely, with an electrically insulating protective coating.

17. The lubricant dispenser according to claim 16, wherein the circuit assembly on the main circuit board (9a) is coated, in certain regions, with a protective coating.

18. The lubricant dispenser according to claim 16, wherein the control circuit-board assembly (9) comprises, in addition to the main circuit board (9a), an additional circuit board (9b) connected to the main circuit board, the additional circuit board (9b) is provided, in certain regions or entirely, with a protective coating.

19. A lubricant dispenser (1) comprising:
a lubricant reservoir (2),
an electromechanical drive (7) that acts on at least one actuation element (4) for discharging lubricant from the lubricant reservoir (2),
a battery (8) that provides a battery voltage (VB),
a control circuit-board assembly (9) that comprises at least one main circuit board (9a) having an electronic circuit assembly comprising at least one central microcontroller (10) and additional electronic functional components as well as conductor tracks (11),
wherein the electronic circuit assembly is subdivided into a plurality of circuit islands (E1 to E9), or has multiple circuit islands (E1 to E9),
wherein some or all of the circuit islands are each power limited, and
wherein distances of the conductor tracks (11)
between individual circuit islands without a protective coating does not drop below a predetermined first minimum distance of 1.5 mm and/or
between individual circuit islands having a protective coating does not drop below a second minimum distance of 0.5 mm, and/or
within a circuit island does not drop below a third minimum distance of 0.2 mm, for example, with or without a protective coating.

20. A lubricant dispenser (1) comprising:
a lubricant reservoir (2),
an electromechanical drive (7) that acts on at least one actuation element (4) for discharging lubricant from the lubricant reservoir (2),
a battery (8) that provides a battery voltage (VB),
a control circuit-board assembly (9) that comprises at least one main circuit board (9a) having an electronic circuit assembly comprising at least one central microcontroller (10) and additional electronic functional components as well as conductor tracks (11),
wherein the electronic circuit assembly is subdivided into a plurality of circuit islands (E1 to E9), or has multiple circuit islands (E1 to E9),
wherein some or all of the circuit islands are each power limited, and
wherein the microcontroller (10), together with further functional components, forms a common (first) circuit island (E1), wherein the functional components in the first circuit island (E1) are supplied with voltage only by way of the microcontroller.

21. A lubricant dispenser (1) comprising:
a lubricant reservoir (2),
an electromechanical drive (7) that acts on at least one actuation element (4) for discharging lubricant from the lubricant reservoir (2),
a battery (8) that provides a battery voltage (VB),
a control circuit-board assembly (9) that comprises at least one main circuit board (9a) having an electronic circuit assembly comprising at least one central microcontroller (10) and additional electronic functional components as well as conductor tracks (11),
wherein the electronic circuit assembly is subdivided into a plurality of circuit islands (E1 to E9), or has multiple circuit islands (E1 to E9),
wherein some or all of the circuit islands are each power limited, and
wherein the circuit assembly in a circuit island (E6), comprises a motor circuit (21) connected with the motor, which is connected to the battery voltage (VB) which is non-reduced and unregulated.

22. A lubricant dispenser (1) comprising:
a lubricant reservoir (2),
an electromechanical drive (7) that acts on at least one actuation element (4) for discharging lubricant from the lubricant reservoir (2),
a battery (8) that provides a battery voltage (VB),
a control circuit-board assembly (9) that comprises at least one main circuit board (9a) having an electronic circuit assembly comprising at least one central microcontroller (10) and additional electronic functional components as well as conductor tracks (11),
wherein the electronic circuit assembly is subdivided into a plurality of circuit islands (E1 to E9), or has multiple circuit islands (E1 to E9),
wherein some or all of the circuit islands are each power limited, and
wherein the circuit assembly is equipped with a circuit board detection, which detects the use of an additional circuit board.

23. A lubricant dispenser (1) comprising:
a lubricant reservoir (2),
an electromechanical drive (7) that acts on at least one actuation element (4) for discharging lubricant from the lubricant reservoir (2),
a battery (8) that provides a battery voltage (VB),
a control circuit-board assembly (9) that comprises at least one main circuit board (9a) having an electronic circuit assembly comprising at least one central microcontroller (10) and additional electronic functional components as well as conductor tracks (11),
wherein the electronic circuit assembly is subdivided into a plurality of circuit islands (E1 to E9), or has multiple circuit islands (E1 to E9),
wherein some or all of the circuit islands are each power limited, and
wherein in addition to a current limitation of one or more circuit islands between individual circuit islands that are connected to one another, a current limitation is implemented by means of one or more resistors (R4, R5, R6, R7, R8, R9) arranged between two circuit islands.

* * * * *